(12) United States Patent
Chen et al.

(10) Patent No.: US 9,065,395 B2
(45) Date of Patent: Jun. 23, 2015

(54) SPEAKER CONTROL SYSTEM

(71) Applicant: Wistron Corporation, New Taipei (TW)

(72) Inventors: Yi-Shang Chen, New Taipei (TW);
Chun-Hao Hsu, New Taipei (TW);
Yi-Fan Chen, New Taipei (TW)

(73) Assignee: Wistron Corporation, Hsichih, New Taipei (TW)

( * ) Notice: Subject to any disclaimer, the term of this patent is extended or adjusted under 35 U.S.C. 154(b) by 399 days.

(21) Appl. No.: 13/670,463

(22) Filed: Nov. 7, 2012

(65) Prior Publication Data

US 2014/0079249 A1    Mar. 20, 2014

(30) Foreign Application Priority Data

Sep. 19, 2012    (TW) .............................. 101134249 A

(51) Int. Cl.
*H03F 99/00*    (2009.01)
*H03F 1/30*    (2006.01)
*H03F 3/185*    (2006.01)

(52) U.S. Cl.
CPC ................ *H03F 1/305* (2013.01); *H03F 3/185* (2013.01); *H03F 2200/408* (2013.01)

(58) Field of Classification Search
CPC .... H03F 1/305; H03F 3/185; H03F 2200/408
USPC ...................... 327/538; 330/10, 51, 297, 149; 360/74.4; 381/55, 94.5, 120; 323/282
See application file for complete search history.

(56) References Cited

U.S. PATENT DOCUMENTS

| | | | | |
|---|---|---|---|---|
| 3,846,831 A * | 11/1974 | Johnson | ....................... | 360/74.4 |
| 5,436,588 A * | 7/1995 | Ghaffaripour | ................ | 327/538 |
| 5,642,074 A * | 6/1997 | Ghaffaripour et al. | ......... | 330/51 |
| 5,703,529 A * | 12/1997 | Ghaffaripour et al. | ......... | 330/51 |
| 6,229,389 B1 * | 5/2001 | Pullen et al. | ..................... | 330/10 |
| 6,255,903 B1 * | 7/2001 | Leffel | ............... | 330/51 |
| 6,346,854 B1 * | 2/2002 | Heithoff | ........................ | 330/149 |
| 7,043,033 B1 * | 5/2006 | Toosky | ......................... | 381/120 |
| 7,161,424 B2 * | 1/2007 | Inagaki | ........................... | 330/51 |
| 7,265,614 B2 * | 9/2007 | Chang et al. | .................... | 330/51 |

(Continued)

FOREIGN PATENT DOCUMENTS

TW    M339175    8/2008

OTHER PUBLICATIONS

Office action mailed on Aug. 12, 2014 for the Taiwan application No. 101134249, filing date: Sep. 19, 2012, p. 1 line 12-14 and p. 2 line 1-19 and 23-24.

*Primary Examiner* — Gerald Gauthier
(74) *Attorney, Agent, or Firm* — Winston Hsu; Scott Margo

(57) ABSTRACT

A speaker control system includes a speaker; an audio amplifier electrically connected to the speaker and used for driving the speaker, the audio amplifier having a shutdown pin and a reference voltage input pin; a switch circuit, a first end of the switch circuit being electrically connected to the shutdown pin and a second end of the switch circuit being connected to the reference voltage input pin; and a processor electrically connected to the shutdown pin and the first end, when the processor outputs a first voltage signal, the audio amplifier being enabled and the reference voltage input pin being kept at a reference voltage, when the processor outputs a second voltage signal, the audio amplifier being disabled and the switch circuit switching the reference voltage input pin from the reference voltage to a low voltage level.

5 Claims, 3 Drawing Sheets

(56) References Cited

U.S. PATENT DOCUMENTS

| | | | |
|---|---|---|---|
| 7,315,204 B2 * | 1/2008 | Seven | 330/51 |
| 7,463,742 B2 * | 12/2008 | Inagaki | 381/94.5 |
| 7,701,294 B1 * | 4/2010 | Yun | 330/297 |
| 7,804,967 B2 * | 9/2010 | Kang | 381/94.5 |
| 7,859,332 B2 * | 12/2010 | Pujol et al. | 330/51 |
| 8,416,956 B2 * | 4/2013 | Honda | 381/55 |
| 8,472,644 B2 * | 6/2013 | Chen et al. | 381/120 |
| 8,965,006 B2 * | 2/2015 | Hung et al. | 381/94.5 |
| 2010/0289470 A1 * | 11/2010 | Chen et al. | 323/282 |
| 2011/0293110 A1 | 12/2011 | Chen | |
| 2014/0079249 A1 * | 3/2014 | Chen et al. | 381/120 |

\* cited by examiner

SPEAKER CONTROL SYSTEM

BACKGROUND OF THE INVENTION

1. Field of the Invention

The invention relates to a speaker control system and, more particularly, to a speaker control system capable of eliminating pop noise while an audio amplifier is shut down.

2. Description of the Prior Art

So far most of electronic devices are equipped with a speaker for playing audio. The speaker usually works with an audio amplifier. The audio amplifier is used for amplifying analog audio signals and driving the speaker. The audio amplifier is a common component used in a consumer electronic device. However, pop noise always occurs while the audio amplifier is switched on or off due to voltage variation resulted from isolation capacitance, charge/discharge at output stage, and so on.

SUMMARY OF THE INVENTION

The invention provides a speaker control system capable of eliminating pop noise while an audio amplifier is shut down so as to solve the aforesaid problems.

According to the claimed invention, a speaker control system comprises a speaker; an audio amplifier electrically connected to the speaker and used for driving the speaker, the audio amplifier having a shutdown pin and a reference voltage input pin; a switch circuit, a first end of the switch circuit being electrically connected to the shutdown pin and a second end of the switch circuit being connected to the reference voltage input pin; and a processor electrically connected to the shutdown pin and the first end, when the processor outputs a first voltage signal to the shutdown pin and the first end, the audio amplifier being enabled and the reference voltage input pin being kept at a reference voltage, when the processor outputs a second voltage signal to the shutdown pin and the first end, the audio amplifier being disabled and the switch circuit switching the reference voltage input pin from the reference voltage to a low voltage level.

According to the claimed invention, the switch circuit comprises a diode and a resistor, and the diode is connected to the resistor in series.

According to the claimed invention, the diode is a PN diode, a negative electrode of the PN diode is electrically connected to the shutdown pin and the processor, a positive electrode of the PN diode is electrically connected to the reference voltage input pin, the first voltage signal has a high voltage level, and the second voltage signal has a low voltage level.

According to the claimed invention, the switch circuit comprises a P-type transistor, a gate electrode of the P-type transistor is electrically connected to the shutdown pin and the processor, a source electrode of the P-type transistor is electrically connected to the reference voltage input pin, a drain electrode of the P-type transistor is grounded, the first voltage signal has a high voltage level, and the second voltage signal has a low voltage level.

According to the claimed invention, the switch circuit comprises a N-type transistor, a gate electrode of the N-type transistor is electrically connected to the shutdown pin and the processor, a drain electrode of the N-type transistor is electrically connected to the reference voltage input pin, a source electrode of the N-type transistor is grounded, the first voltage signal has a low voltage level, and the second voltage signal has a high voltage level.

As mentioned in the above, when the processor outputs the second voltage signal to the shutdown pin of the audio amplifier and the switch circuit to disable the audio amplifier (i.e. to shut down the audio amplifier), the switch circuit switches the reference voltage input pin of the audio amplifier from a reference voltage to a low voltage level (lower than about 0.7V). In other words, the invention utilizes the switch circuit and the shutdown pin of the audio amplifier together to switch on/off the audio amplifier. Accordingly, the invention can eliminate pop noise effectively while the audio amplifier is shut down.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
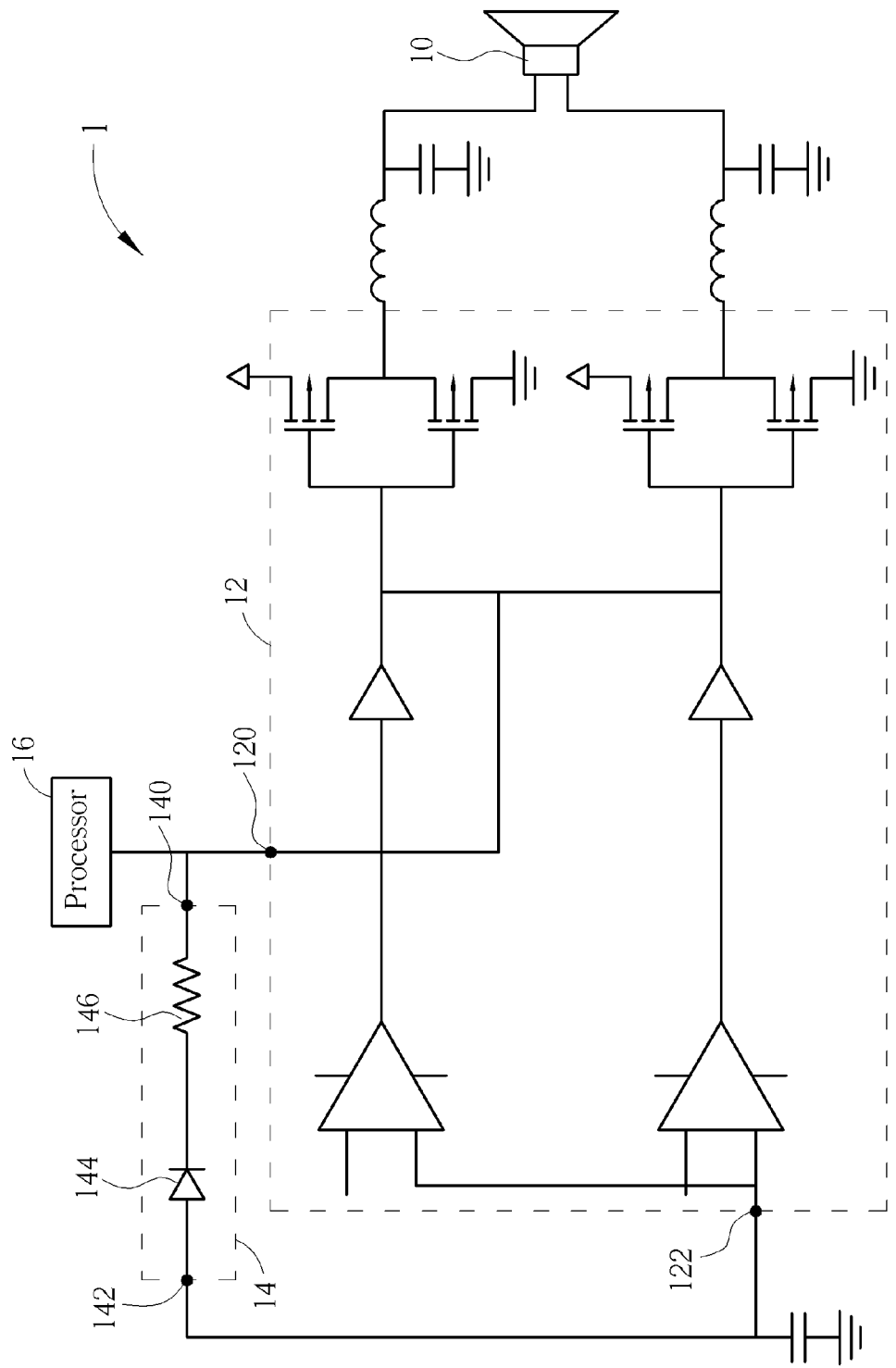
FIG. 1 is a schematic diagram illustrating a speaker control system according to an embodiment of the invention.

Referring to FIG. 1, FIG. 1 is a schematic diagram illustrating a speaker control system 1 according to an embodiment of the invention. As shown in FIG. 1, the speaker control system 1 comprises a speaker 10, an audio amplifier 12, a switch circuit 14 and a processor 16. The audio amplifier 12 is electrically connected the speaker 10 and used for amplifying analog audio signals and driving the speaker 10. The audio amplifier 12 has a shutdown pin 120 and a reference voltage input pin 122. A first end 140 of the switch circuit 14 is electrically connected to the shutdown pin 120 and a second end 142 of the switch circuit 14 is electrically connected to the reference voltage input pin 122. The processor 16 is electrically connected to the shutdown pin 120 of the audio amplifier 12 and the first end 140 of the switch circuit 14.

The switch circuit 14 comprises a diode 144 and a resistor 146, and the diode 144 is connected to the resistor 146 in series. In this embodiment, the diode 144 is a PN diode, wherein a negative electrode of the PN diode 144 is electrically connected to the shutdown pin 120 of the audio amplifier 12 and the processor 16 through the resistor 146, and a positive electrode of the PN diode 144 is electrically connected to the reference voltage input pin 122 of the audio amplifier 12. Furthermore, in this embodiment, the processor 16 outputs a first voltage signal, which has a high voltage level, to enable the audio amplifier 12 (i.e. to boot the audio amplifier 12) and outputs a second voltage signal, which has a low voltage level, to disable the audio amplifier 12 (i.e. to shut down the audio amplifier 12).

Therefore, when the processor 16 outputs the first voltage signal, which has a high voltage level, to the shutdown pin 120 of the audio amplifier 12 and the first end 140 of the switch circuit 14, the audio amplifier 12 is enabled and the reference voltage input pin 122 is kept at a reference voltage. On the other hand, when the processor 16 outputs the second voltage signal, which has a low voltage level, to the shutdown pin 120 of the audio amplifier 12 and the first end 140 of the switch circuit 14, the audio amplifier 12 is disabled and the switch circuit 14 switches the reference voltage input pin 122 from the reference voltage to a low voltage level, which is lower than about 0.7V. Accordingly, the speaker control system 1 of the invention can eliminate pop noise effectively while the audio amplifier 12 is shut down. It should be noted that the resistor 146 may be also connected to the positive electrode of the PN diode 144 and it depends upon practical applications.

Figure 2:
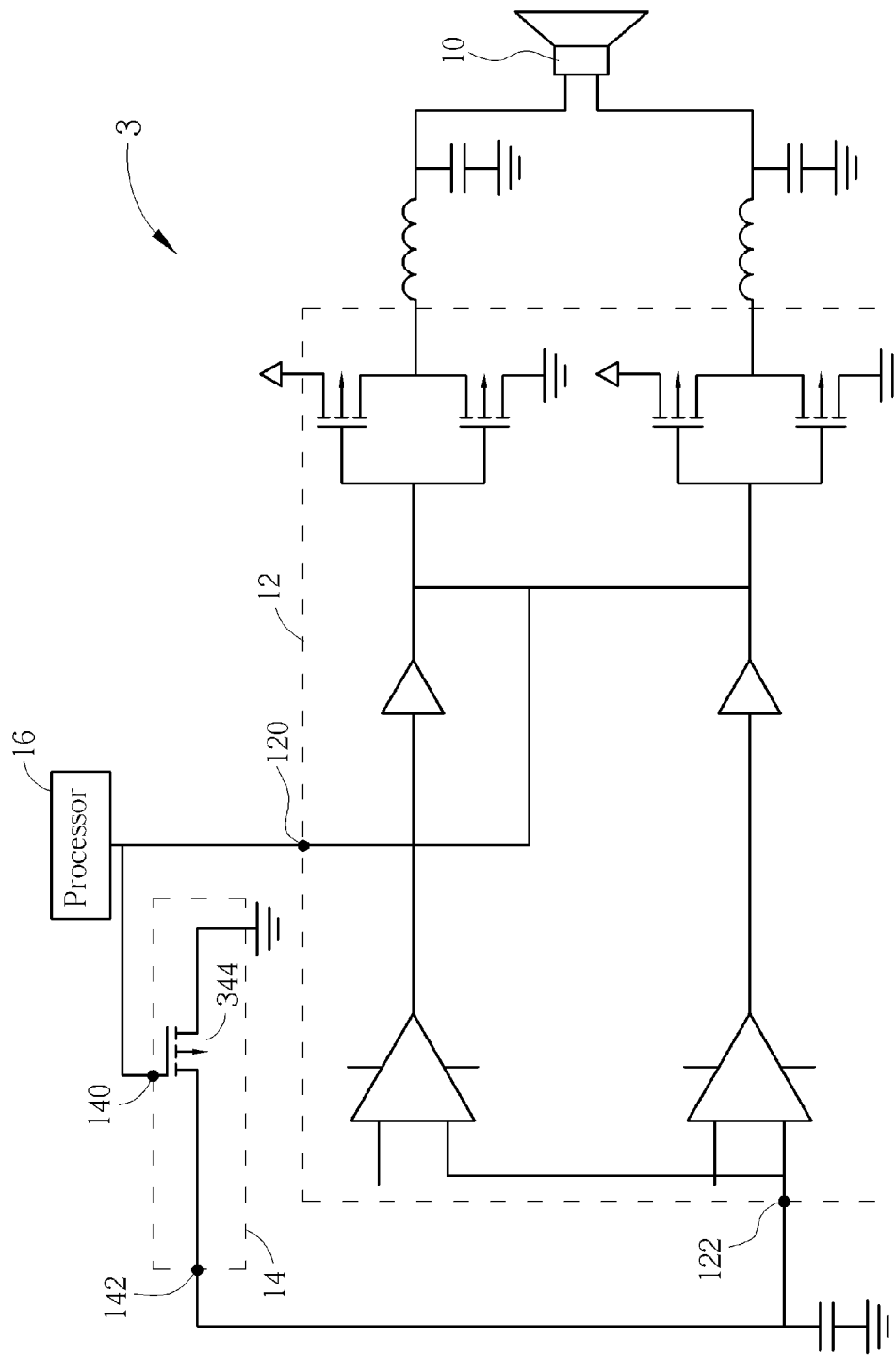
FIG. 2 is a schematic diagram illustrating a speaker control system according to another embodiment of the invention.

Referring to FIG. 2, FIG. 2 is a schematic diagram illustrating a speaker control system 3 according to another embodiment of the invention. The main difference between the speaker control system 3 and the aforesaid speaker control system 1 is that the switch circuit 14 of the speaker control system 3 comprises a P-type transistor 344, wherein a gate electrode of the P-type transistor 344 is electrically connected to the shutdown pin 120 of the audio amplifier 12 and the processor 16, a source electrode of the P-type transistor 344 is electrically connected to the reference voltage input pin 122 of the audio amplifier 12, and a drain electrode of the P-type transistor 344 is grounded. Furthermore, in this embodiment, the processor 16 outputs a first voltage signal, which has a high voltage level, to enable the audio amplifier 12 (i.e. to boot the audio amplifier 12) and outputs a second voltage signal, which has a low voltage level, to disable the audio amplifier 12 (i.e. to shut down the audio amplifier 12).

Therefore, when the processor 16 outputs the first voltage signal, which has a high voltage level, to the shutdown pin 120 of the audio amplifier 12 and the first end 140 of the switch circuit 14, the audio amplifier 12 is enabled and the P-type transistor 344 is switched off such that the reference voltage input pin 122 is kept at a reference voltage. On the other hand, when the processor 16 outputs the second voltage signal, which has a low voltage level, to the shutdown pin 120 of the audio amplifier 12 and the first end 140 of the switch circuit 14, the audio amplifier 12 is disabled and the P-type transistor 344 is switched on such that the switch circuit 14 switches the reference voltage input pin 122 from the reference voltage to a low voltage level, which is lower than about 0.7V. Accordingly, the speaker control system 3 of the invention can eliminate pop noise effectively while the audio amplifier 12 is shut down. It should be noted that the P-type transistor 344 may be also a PNP transistor instead of the PMOS transistor shown in FIG. 2 and it depends upon practical applications.

Figure 3:
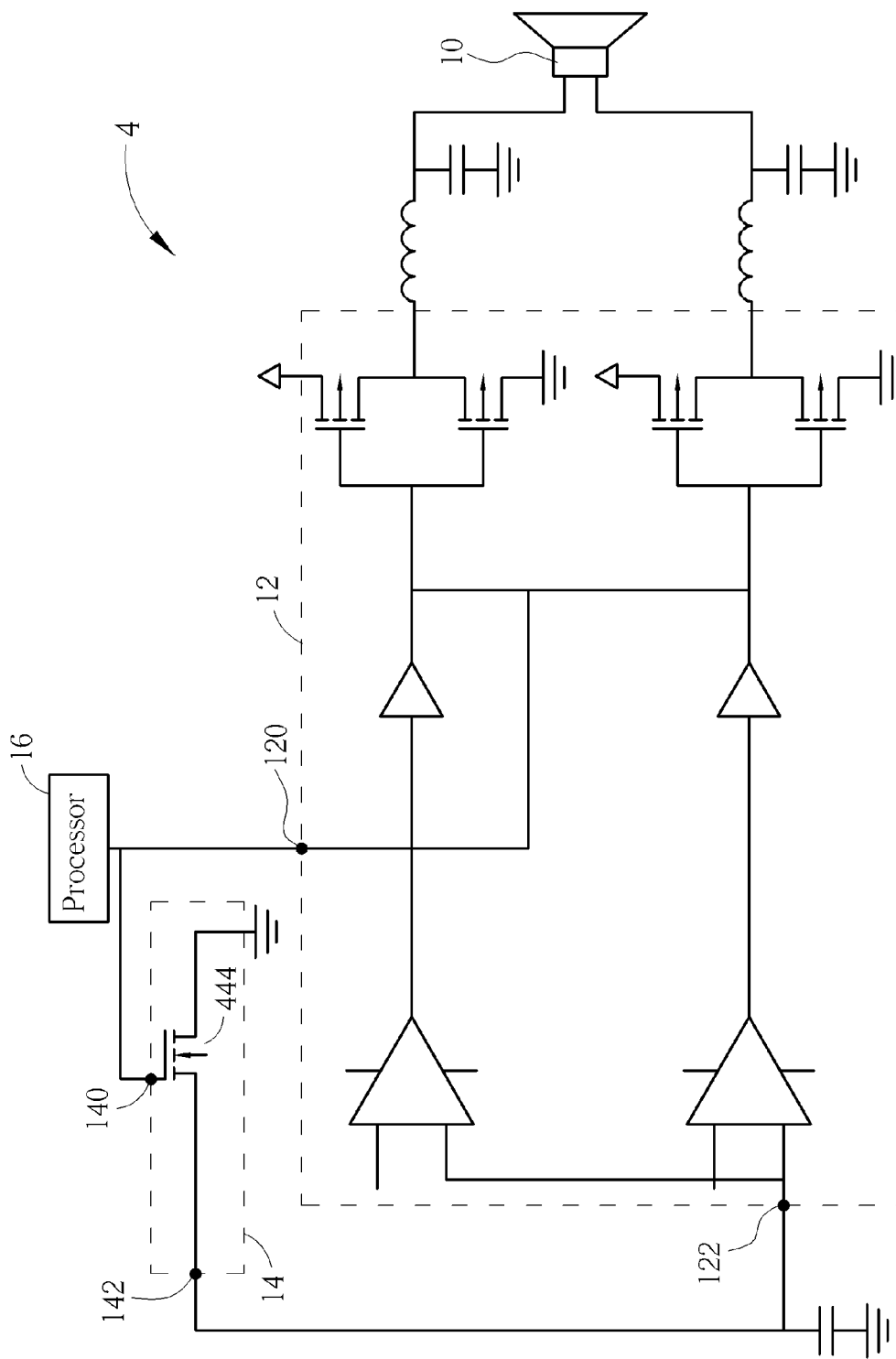
FIG. 3 is a schematic diagram illustrating a speaker control system according to another embodiment of the invention.

Referring to FIG. 3, FIG. 3 is a schematic diagram illustrating a speaker control system 4 according to another embodiment of the invention. The main difference between the speaker control system 4 and the aforesaid speaker control system 1 is that the switch circuit 14 of the speaker control system 4 comprises an N-type transistor 444, wherein a gate electrode of the N-type transistor 444 is electrically connected to the shutdown pin 120 of the audio amplifier 12 and the processor 16, a drain electrode of the N-type transistor 444 is electrically connected to the reference voltage input pin 122 of the audio amplifier 12, and a source electrode of the N-type transistor 444 is grounded. Furthermore, in this embodiment, the processor 16 outputs a first voltage signal, which has a low voltage level, to enable the audio amplifier 12 (i.e. to boot the audio amplifier 12) and outputs a second voltage signal, which has a high voltage level, to disable the audio amplifier 12 (i.e. to shut down the audio amplifier 12).

Therefore, when the processor 16 outputs the first voltage signal, which has a low voltage level, to the shutdown pin 120 of the audio amplifier 12 and the first end 140 of the switch circuit 14, the audio amplifier 12 is enabled and the N-type transistor 444 is switched off such that the reference voltage input pin 122 is kept at a reference voltage. On the other hand, when the processor 16 outputs the second voltage signal, which has a high voltage level, to the shutdown pin 120 of the audio amplifier 12 and the first end 140 of the switch circuit 14, the audio amplifier 12 is disabled and the N-type transistor 444 is switched on such that the switch circuit 14 switches the reference voltage input pin 122 from the reference voltage to a low voltage level, which is lower than about 0.7V. Accordingly, the speaker control system 4 of the invention can eliminate pop noise effectively while the audio amplifier 12 is shut down. It should be noted that the N-type transistor 444 may be also an NPN transistor instead of the NMOS transistor shown in FIG. 3 and it depends upon practical applications.

The aforesaid speaker control systems 1, 3 and 4 can be applied to any electronic devices equipped with a speaker so as to eliminate pop noise while the audio amplifier is shut down.

As mentioned in the above, when the processor outputs the second voltage signal to the shutdown pin of the audio amplifier and the switch circuit to disable the audio amplifier (i.e. to shut down the audio amplifier), the switch circuit switches the reference voltage input pin of the audio amplifier from a reference voltage to a low voltage level, which is lower than about 0.7V. In other words, the invention utilizes the switch circuit and the shutdown pin of the audio amplifier together to switch on/off the audio amplifier. Accordingly, the invention can eliminate pop noise effectively while the audio amplifier is shut down.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A speaker control system comprising:
a speaker;
an audio amplifier electrically connected to the speaker and used for driving the speaker, the audio amplifier having a shutdown pin and a reference voltage input pin;
a switch circuit, a first end of the switch circuit being electrically connected to the shutdown pin and a second end of the switch circuit being connected to the reference voltage input pin; and
a processor electrically connected to the shutdown pin and the first end, when the processor outputs a first voltage signal to the shutdown pin and the first end, the audio amplifier being enabled and the reference voltage input pin being kept at a reference voltage, when the processor outputs a second voltage signal to the shutdown pin and the first end, the audio amplifier being disabled and the switch circuit switching the reference voltage input pin from the reference voltage to a low voltage level.

2. The speaker control system of claim 1, wherein the switch circuit comprises a diode and a resistor, and the diode is connected to the resistor in series.

3. The speaker control system of claim 2, wherein the diode is a PN diode, a negative electrode of the PN diode is electrically connected to the shutdown pin and the processor, a positive electrode of the PN diode is electrically connected to the reference voltage input pin, the first voltage signal has a high voltage level, and the second voltage signal has a low voltage level.

4. The speaker control system of claim 1, wherein the switch circuit comprises a P-type transistor, a gate electrode of the P-type transistor is electrically connected to the shutdown pin and the processor, a source electrode of the P-type transistor is electrically connected to the reference voltage input pin, a drain electrode of the P-type transistor is grounded, the first voltage signal has a high voltage level, and the second voltage signal has a low voltage level.

5. The speaker control system of claim 1, wherein the switch circuit comprises an N-type transistor, a gate electrode of the N-type transistor is electrically connected to the shut-down pin and the processor, a drain electrode of the N-type transistor is electrically connected to the reference voltage input pin, a source electrode of the N-type transistor is grounded, the first voltage signal has a low voltage level, and the second voltage signal has a high voltage level.

* * * * *